US007344756B2

(12) United States Patent
Mirkin et al.

(10) Patent No.: US 7,344,756 B2
(45) Date of Patent: Mar. 18, 2008

(54) METHOD FOR SCANNING PROBE CONTACT PRINTING

(75) Inventors: Chad Mirkin, Wilmette, IL (US); Hua Zhang, Evanston, IL (US)

(73) Assignee: Northwestern University, Evanston, IL (US)

( * ) Notice: Subject to any disclaimer, the term of this patent is extended or adjusted under 35 U.S.C. 154(b) by 555 days.

(21) Appl. No.: 10/671,381

(22) Filed: Sep. 25, 2003

(65) Prior Publication Data

US 2004/0226464 A1 Nov. 18, 2004

Related U.S. Application Data

(62) Division of application No. 10/440,022, filed on May 16, 2003.

(51) Int. Cl.
*B05D 1/36* (2006.01)
(52) U.S. Cl. .................... 427/256; 427/258; 977/857; 977/860; 977/875; 977/877
(58) Field of Classification Search ................ 427/256, 427/258; 977/857, 860, 875, 877
See application file for complete search history.

(56) References Cited

U.S. PATENT DOCUMENTS

| | | | |
|---|---|---|---|
| 5,053,100 A | 10/1991 | Hayes et al. |
| 5,514,501 A | 5/1996 | Tarlov |
| 5,610,898 A | 3/1997 | Takimoto et al. |
| 5,883,387 A | 3/1999 | Matsuyama et al. |
| 5,922,214 A | 7/1999 | Liu et al. |
| 5,923,637 A | 7/1999 | Shimada et al. |
| 6,156,215 A | 12/2000 | Shimada et al. |
| 6,284,113 B1 | 9/2001 | Bjornson et al. |
| 6,291,140 B1 | 9/2001 | Andreoli et al. |
| 6,353,219 B1 | 3/2002 | Kley |
| 6,409,900 B1 | 6/2002 | Parce et al. |
| 6,429,025 B1 | 8/2002 | Parce et al. |
| 6,444,111 B1 | 9/2002 | Montgomery |
| 6,555,389 B1 | 4/2003 | Ullman et al. |
| 6,635,311 B1 | 10/2003 | Mirkin et al. |
| 6,642,129 B2 | 11/2003 | Liu et al. |
| 6,827,979 B2 | 12/2004 | Mirkin et al. |
| 6,867,443 B2 | 3/2005 | Liu et al. |
| 6,943,417 B2 | 9/2005 | Boland et al. |
| 7,034,854 B2 | 4/2006 | Cruchon-Dupeyrat et al. |
| 7,042,828 B2 | 5/2006 | Kley |
| 7,081,624 B2 | 7/2006 | Liu et al. |
| 2001/0020588 A1 | 9/2001 | Adourian et al. |
| 2001/0036674 A1 | 11/2001 | Indermuhle et al. |
| 2002/0025279 A1 | 2/2002 | Weigl et al. |
| 2002/0123153 A1 | 9/2002 | Moon et al. |
| 2003/0017077 A1 | 1/2003 | Hahn et al. |
| 2003/0026740 A1 | 2/2003 | Staats |
| 2003/0049381 A1 | 3/2003 | Mirkin et al. |
| 2003/0082080 A1 | 5/2003 | Zimmermann et al. |
| 2004/0007053 A1 | 1/2004 | Lutter et al. |
| 2004/0018116 A1 | 1/2004 | Desmond et al. |
| 2004/0175631 A1 | 9/2004 | Crocker et al. |
| 2004/0223886 A1 | 11/2004 | Liu et al. |
| 2004/0228962 A1 | 11/2004 | Liu et al. |
| 2005/0201257 A1 | 9/2005 | Champion et al. |
| 2005/0236566 A1 | 10/2005 | Liu |

FOREIGN PATENT DOCUMENTS

| | | |
|---|---|---|
| EP | 0786642 | 7/1997 |
| EP | 0786642 A1 | 7/1997 |
| EP | 1388369 A2 | 2/2004 |
| WO | WO99/56176 | 11/1999 |
| WO | WO 99/56176 A1 * | 11/1999 |
| WO | WO 00/41213 | 7/2000 |
| WO | WO 01/91855 A1 | 12/2001 |
| WO | WO 2004/105046 A2 | 12/2004 |

OTHER PUBLICATIONS

Hong et al., "Multiple Ink Nanolithography: Toward a Multiple-Pen Nano-Plotter," Science, vol. 286, pp. 523-525, Oct. 15, 1999.*
Niklaus, F., "Void-Free Full Wafer Adhesive Bonding", presented at MEMS'00, Miyazaci, Japan, Jan. 23-27, 2000, pp. 323-328, Miyazaki, Japan.
Pierret, Robert F., Semiconductor Device Fundamentals, Table 1.1, (1995), Addison-Wesley, p. 4.
Higa, K. et al., "Fabrication of Microcantilever with a Silicon Tip Prepared by Anodization", Japanese Journal of Applied Physics, vol. 37, No. 12B, pp. 7078-7080, (1998).
International Search Report for Application No. PCT/US2004/015161 dated Oct. 27, 2004.
Brittain, C., et al., "Soft Lithography and Microfabrication", 1998, Physics World, 11, 31-36.
Kumar, A.., et al., "Patterning Self Assembled Monolayers: Applications in Material Science", 1994, Langmuir, 10, pp. 1498-1511.
Lopez, G.P., et al., "Fabrication and Imaging of Two-Dimensional Patterns of Proteins Adsorbed on Self-Assembled Monolayers by Scanning Electron Microscopy", 1993, Journal of American Chemical Society, 115, pp. 10774-10781.
Branch, D.W., et al., "Microstamp Patterns of Biomolecules for High-Resolution Neuronal Networks", 1998, Medical and Biological Engineering and Computing, vol. 36, pp. 135-141.
Marzolin, C., et al., "Patterning of a Polysiloxane Precursor to Silicate Glasses by Microcontact Printing", 1998, Thin Solid Films, 315, pp. 9-12.

(Continued)

*Primary Examiner*—William Phillip Fletcher, III
(74) *Attorney, Agent, or Firm*—Evan Law Group LLC (57) ABSTRACT

A method for fabricating scanning probe microscopy (SPM) probes is disclosed. The probes are fabricated by forming a structural layer on a substrate, wherein the substrate forms a cavity. A sacrificial layer is located between the substrate and the structural layer. Upon forming the structural layer, the sacrificial layer is selectively removed, and the probe is then released from the substrate. The substrate may then later be reused to form additional probes. Additionally, a contact printing method using a scanning probe microscopy probe is also disclosed.

14 Claims, 10 Drawing Sheets

OTHER PUBLICATIONS

Xia, Y. et al., "Soft Lithography", 1998, Annual Review of Material Science, 28, pp. 153-184.

K. Ryu, et al., "Precision Patterning of PDMS Thin Films: A New Fabrication Method and Its Applications", Sixth International Symposium on Micro Total Analysis System (mTAS), Nara, Japan, Nov. 3-7, 2002.

Libiouille, L., et al., "Contact-Inking for Microcontact Printing of Alkanethiols on Gold", 1999, Langmuir, 15, pp. 300-304.

Encyclopedia of Chemical Technology, vol. 14, Kirk-Othmer, 1995, pp. 677-709.

Khoo, M., et al., "Micro Magnetic Silicone Elastomer Membrane Actuator", 2001, Sensors and Actuators, 89(3), pp. 259-266.

Jo, B., et al., "Three-Dimensional Micro-Channel Fabrication in Polydimethylsiloxane (PDMS) Elastomer", 2000, J. MEMS, vol. 9, pp. 76-81.

Hertel, T., et al., "Manipulation of Individual Carbon Nanotubes and Their Interaction with Surfaces", 1998, Journal of Physical Checistry B, vol. 102, pp. 910-915.

Snow, E., et al., "Nanofabrication with Proximal Probes", 1997, Proceedings of the IEEE, vol. 85, pp. 601-611.

Wilson, D.L., et al., "Surface Organization and Nanopatterning of Collagen by Dip-Pen Nanolithography", 2001, PNAS, vol. 98, pp. 13660-13664.

Belaubre, P., et al., "Fabrication of Biological Microarrays Using Microcantilevers", 2003, Applied Physics Letters, vol. 82, pp. 3122-3124.

Lutwyche, M., et al., "5×5 2D AFM Cantilever Arrays A First Step Towards A Terabit Storage Device", 1999, Sensors and Actuators A: Physical, vol. 73, pp. 89-94.

Vettiger, P., et al., "Ultrahigh Density, High-data-rate NEMS-based AFM Storage System", 1999, Microelectronic Engineering, vol. 46, pp. 11-17.

Cooper, E.B., et al., "Terabit-Per-Square-Inch Data Storage With the Atomic Force Microscope", 1999, Applied Physics Letters, vol. 75, pp. 3566-3568.

Piner, R.D., et al., "'Dip-Pen' Nanolithography", 1999, Science, vol. 283, pp. 661-663.

Wu, G., et al., "Origin of Nanomechanical Cantilever Motion Generated from Biomolecular Interactions", 2001, Proceedings of the National Academy of Sciences, vol. 98, pp. 1560-1564.

Zhang, M., et al., "A MEMS Nanoplotter with High-Density Parallel Dip-Pen Nanolithography Probe Arrays", 2002, Journal of Nanotechnology, vol. 13, pp. 212-217.

Chow, E.M., et al., "Characterization of a Two-Dimensional Cantilever Array with Through-Wafer Electrical Interconnects", 2002, Applied Physics Letters, vol. 80, pp. 664-666.

Bullen, D., et al., "Micromachined Arrayed Dip Pen Nanolithography (DPN) Probes for Sub-100 nm Direct Chemistry Patterning", presented at 16th International Conference on Micro Electro Mechanical Systems (MEMS), Kyoto, Japan, 2003.

Minne, S.C., et al., "Parallel Atomic Force Microscopy Using Cantilevers with Integrated Piezoresistive Sensors and Integrated Piezoelectric Actuators", 1995, Applied Physics Letters, vol. 67, pp. 3918-3920.

Liu, C., et al., "Mass-Producible Monolithic Silicon Probes for Scanning Probe Microscopes", 1998, Sensors and Actuators A: Physical, vol. 71, pp. 233-237.

Petersen, K.E., "Silicon As A Mechanical Material" 1982, Proceedings of the IEEE, vol. 70, pp. 420-457.

Minne, S.C., et al., "Centimeter Scale Atomic Force Microscope Imaging and Lithography", 1998, Applied Physics Letters, vol. 73, pp. 1742-1744.

Bullen, D., et al., "Thermo-Mechanical Optimization of Thermally Actuated Cantilever Beam Array" Jul. 2002, Proc. SPIE vol. 4700, Smart Structures and Materials 2002: Smart Electronics, MEMS, and Nanotechnology, pp. 288-295; with separate abstract.

Wang, X., et al., "Scanning Probe with Elastomeric (PDMS) Tip for Scanning Probe Microcontact Printing (SP-uCP)", presented at the 12th International Conference on Solid-State Sensors, Actuators and Microsystems, Boston, MA, Jun. 8-12, 2003.

Wang, X., et al., "Scanning Probe Contact Printing", 2003, Langmuir, vol. 19, pp. 8951-8955.

Kim et al., "A novel AFM Chip for fountain pen nanolithography—design and microfabrication," Mat. Res. Soc. Symp. Proc., vol. 782, pp. A5.56.1-A5.56.6, 2004.

Xu et al., "Microfabricated quill-type surface patterning tools for the creation of biological micro/nano arrays," Biomedical Microdevices 6:2, pp. 117-123, 2004.

Deladi et al., "Micromachined fountain pen for atomic force microscope-based nanopatterning," Applied Physics Letters, vol. 85, No. 22, pp. 5361-5363, 2004.

Lewis et al., "Fountain pen nanochemistry: atomic force control of chrome etching," Applied Physics Letters, vol. 75, No. 17, pp. 2689-2691, 1999.

Baldock et al., "Microfabricated Devices for Chemical and Biochemical Analysis Systems," located at http://www.in.umist.ac.uk/, presented at Microsystems 2010, Daresbury, Cheshire, 1 page, 2000.

Bullen et al., "Design, Fabrication, and Characterization of Thermally Actuated Probe Arrays for Dip Pen Nanolithography," J. Microelectromechanical Systems, vol. 13, No. 4, pp. 594-602, Aug. 2004.

Higa et al., "Fabrication of Microcantilever with a Silicon Tip Prepared by Anodization", Japanese Journal of Applied Physics, vol. 37, Part 1, No. 12B, pp. 7078-7080, 1998.

Hong et al., "A nanoplotter with both parallel and serial writing capabilities," Science, vol. 288, pp. 1808-1811, 2000.

International Search Report and Written Opinion for PCT Application No. PCT/US04/13974, 9 pages, dated Nov. 30, 2005.

International Search Report for PCT Application No. PCT/US2004/015161,7 pages, dated Feb. 10, 2005.

Wang et al., "Multifunctional probe array for nano patterning and imaging," Nano Letters, vol. 5, No. 10, pp. 1867-1872, 2005.

International Search Report and Written Opinion for PCT Application No. PCT/US20006/035826, 13 pages, dated Dec. 19, 2006.

Van Zant, "Microchip Fabrication: A Practical Guide to Semiconductor Processing," Chapter 16 Semiconductor Devices and Integrated Circuit Formation, pp. 491-529, 2000.

Wang et al., "Scanning probe lithography tips with spring-on tip designs: Analysis, fabrication, and testing," Applied Physics Letters, 87, 054102-1 to 054102-3, 2005.

Zou et al., "A mould-and-transfer technology for fabricating scanning probe microscopy probes," Journal of Micromechanics and Microengineering, vol. 14, pp. 204-211, 2004.

Wang et al., "Thermally actuated probe array for parallel dip-pen nanolithography," J. Vac. Sci. Technol. B., 22(6), pp. 2563-2567, 2004.

Zhang et al., "Passive and Active Probe Arrays for Dip-Pen Nanolithography," First IEEE Conference on Nanotechnology, Maui, HI, 5 pages, 2001.

Hong et al., "Multiple Ink Nanolithography: Toward a Multiple-Pen Nano-Plotter", Science, vol. 286, pp. 523-525, 1999.

\* cited by examiner

METHOD FOR SCANNING PROBE CONTACT PRINTING

RELATED APPLICATION DATA

The present application is a divisional of U. S. application Ser. No. 10/440,022, filed May 16, 2003, which is incorporated herein by reference to the extent permitted by law.

FEDERALLY SPONSORED RESEARCH OR DEVELOPMENT

This invention was made with Government support under the National Science Foundation under the NSF Program (Grant No. 0118025), DARPA Grant No. DAAD-19-00-1-0414 and AFOSR Grant No. F49620-00-1-0283 and by DARPA/AFOSR Grant No. ARMY NW 0650 300 F245. The government may have certain rights in this invention.

BACKGROUND

This invention relates generally to scanning probe microscopy (hereinafter "SPM"), and in particular, to an SPM probe formed with an integrated tip and to a method of printing with an SPM probe.

A scanning probe microscope is an important instrument for science and technology. One of the first scanning probe microscopes ever developed was called a Scanning Tunneling Microscope (STM). Another device within the scanning probe microscope family is an Atomic Force Microscope (hereinafter "AFM"). Nowadays, scanning probe microscopes are used to measure surface properties with atomic resolution. For example, scanning probe microscopes can be used to observe the structure of double helix of DNA. The capability of scanning probe microscopes has spread to include imaging of magnetic, optical, thermal, electrostatic charges, and many more. Scanning probe microscopes are also used for biological sensors as the static bending and resonant frequency of a scanning probe microscope is sensitive to the biochemical substances absorbed on it. Scanning probe microscopes are also used to perform nanolithography, such as dip pen nanolithography, and nanomanipulation, that is, interacting with objects on a molecular and an atomic scale.

Scanning probe microscopes use a probe having a flexible cantilever beam with a sharp tip attached at the distal end to perform their measurements. The cantilever beam is very soft, often with a force constant on the order of 0.1 N/m or less. The tip is used to interact with the surface of interest. In an AFM for example, the repulsive force between the surface and the tip causes the cantilever beam to bend. The minute amount of bending in the cantilever beam is picked up by using sensitive instruments, such as by optical deflection. By raster scanning the tip over a sample surface area, a local topological map can be produced. If the tip of the probe is relatively sharp, the topological map may be made with atomic resolution. Typically, the radius of curvature of tips range below 500 nanometers.

Needless to say, the SPM probe's cantilever beam with integrated tip is a performance limiting device in the overall scanning probe microscope system. Many research groups as well as companies that commercialize the scanning probe microscope spend much time to develop the cantilever beam and the tip of the probe. Using current fabrication methods, the cantilever beam is typically made of silicon nitride or single crystal silicon while the tip is typically etched by bulk silicon etching using wet etching chemicals or plasma etching. There are a number of major drawbacks to existing fabrication methods. First, the tips are made sharp using a special, time-sensitive processes that is not very efficient. Additionally, it is difficult to produce large arrays of tips with uniform sharpness. Moreover, the cantilevers are made of inorganic thin films such as silicon nitride or single crystal silicon which require a high temperature process and multiple process steps, such as a bulk silicon etch, to produce. Furthermore, certain processes require removal of a substrate upon which the probes are fabricated upon in order to remove the probe, and more specifically, the cantilever, from the substrate. Thus, a need exists for an improved method for fabricating an SPM probe.

Additionally, there is a need for an improved method for fabricating an SPM probe, including an array of SPM probes, using an efficient process, low cost materials, and a uniform profile. Such probes can then be used in a variety of ways, such as, for SPM, chemical/bio sensing, and nanolithography such as DPN.

There is also a need for an improved method for microcontact printing. Microcontact printing ($\mu$CP) is a soft lithography method capable of creating micro-scale structures on a microscopic level. Microcontact printing uses a stamp to transfer chemical or biological materials, also known as "ink," onto a solid substrate. Microcontact printing creates impressions with the patterned stamp by placing the stamp near, or in contact with, the solid substrate. Microcontact printing does not form images by dragging the stamp across the solid substrate. Repeated contact with the solid substrate can form dots, lines, curves, and other such shapes. The stamp can be made of a variety of materials, such as metals, polymers, and elastomeric materials. One of the more commonly used elastomeric materials is poly (dimethylsiloxane) (PDMS), which is an inert material that is compatible with many chemical and biological inks. Microcontact printing has been used to pattern self-assembled monolayers of alkanethiols, proteins, chemical precursors, and other biological materials on a variety of substrates. Microcontact printing has also been used to transfer chemical or biological materials (inks) onto a solid substrate. However, microcontact printing invariably requires a dedicated photolithography mask to produce inverse mold features, and is limited with respect to multi-ink and alignment registration capabilities. Additionally, the production of the mask can be relatively costly and time consuming, particularly when sub-micrometer features are desired. Moreover, for many applications, such as the generation of proteomic and gene chips, well aligned, sub-micrometer scale features made of many different inks are desirable. Thus, a need exists for a less costly and less time consuming method for microcontact printing.

BRIEF SUMMARY

According to one aspect of the present invention, a method for fabricating a scanning probe microscope probe is provided. The method includes forming a structural layer on a substrate. The substrate forms a cavity. A sacrificial layer is located between the substrate and the structural layer. In one embodiment, the method further includes selectively removing the sacrificial layer. In one embodiment, the method further includes releasing the structural layer from the substrate.

According to another aspect of the present invention, a method for fabricating a scanning probe microscope probe is provided. The method includes forming a structural layer on a substrate. The structural layer has a tip layer and a beam layer. The substrate forms a cavity and the tip layer is in the cavity. The beam layer is on the tip layer. A sacrificial layer is located between the substrate and the tip layer. The method further includes patterning the structural layer.

According to another aspect of the present invention, a scanning probe microscope probe is provided. The probe includes a tip having a first material and a cantilever beam connected with the tip. The cantilever beam includes a second material. The first material includes one of a metal, an oxide, and a polymer, and the second material includes one of a metal, an oxide, and a polymer.

According to another aspect of the present invention, a method for contact printing is provided. The method includes positioning a scanning probe microscopy probe having a tip near a substrate, wherein ink is transferred from the tip to the substrate. The tip comprises a polymer.

It should be appreciated that for simplicity and clarity of illustration, elements shown in the Figures have not necessarily been drawn to scale. For example, the dimensions of some of the elements are exaggerated relative to each other for clarity. Further, where considered appropriate, reference numerals have been repeated among the Figures to indicate corresponding elements.

DETAILED DESCRIPTION

The present invention describes a method for fabricating scanning probe microscopy (SPM) probes. The probes are fabricated by forming a structural layer on a substrate, wherein the substrate forms a cavity. A sacrificial layer is located between the substrate and the structural layer. Upon forming the structural layer, the sacrificial layer is selectively removed, and the probe is then released from the substrate. The substrate may then later be reused to form additional probes. In this manner, an SPM probe can be fabricated that has a well defined tip. Additionally, since the substrate can be reused, the materials cost for producing the probe can be reduced. Moreover, the above-described method for fabricating a probe allows for a variety of materials to be used to manufacture the probe.

Figure 1A:
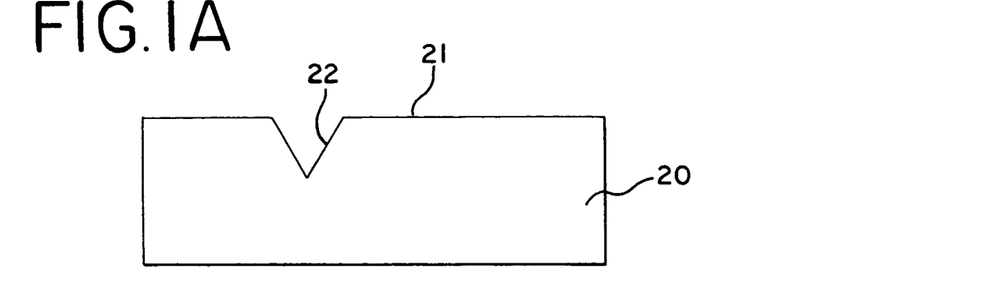
FIGS. 1A-1D illustrate, in cross-section, process steps for the fabrication of an SPM probe, in accordance with one preferred embodiment of the invention.

Shown in FIGS. 3A-3D is a probe 27 suitable for use in a scanning probe microscope. Please note that while FIGS. 1C-1D and FIG. 3, illustrate only one probe 27, and FIGS. 2B-2E illustrate two probes 27, 29, an array of scanning probe microscopy (SPM) probes may have tens or even hundreds of thousands of probes 27, In some instances, arrays of SPM probes may have between one-hundred and ten million probes 27, For the sake of clarity, these additional probes have been left out of FIGS. 1C-1D, FIGS. 2B-2E, and FIGS. 3A-3D.

Probe 27 includes a tip 30 comprising a first material and a cantilever beam 28 comprising a second material. In one embodiment, the first material and the second material are the same material, while in another embodiment, the first material and the second material are different materials. Preferably, the first material and the second material each comprise a material selected from the group consisting of metals such as permalloy, copper, tungsten, titanium, aluminum, silver, and gold; oxides such as silicon dioxide, silicon oxide, and silicon oxynitride; nitrides such as silicon nitride and titanium nitride; and polymers such as poly (dimethylsiloxane) (PDMS), polyimide, parylene, and elastomers such as silicone and rubber. The first and second materials may be formed by chemical reaction with the substrate 20, for example by oxidation, or by coating, for example with chemical vapor deposition or oblique angle physical vapor deposition.

The tip 30 is connected with the cantilever beam 28, The tip 30 may take various forms and shapes, such as pyramidal, conical, wedge, and boxed. In one embodiment, the tip 30 takes a form having a base 40 at one end and a point 42 at another end opposed to the base 40, such as a pyramid, a wedge, and a cone. The width of the tip 30 at the base 40 is greater than the width of the tip 30 at the point 42, as illustrated in FIG. 3A and FIG. 2E. In one embodiment, the tip 30 takes the form of a wedge, as illustrated in FIG. 2E, wherein the width of the tip 30 at the base 40 is greater than the width of the tip 30 at the point 42, as illustrated in FIG. 2E. In one embodiment, the tip 30 takes the form of a pyramid, as illustrated in FIG. 3A. Preferably, the tip 30 has a height "H" of defined as the distance from the base 40 to the point 42, as illustrated in FIG. 3A. Preferably, the tip 30 has a radius of curvature "R" defined at the point 42, as illustrated in FIG. 3A. Preferably, the height "H" is between 1 and 100 microns and the radius of curvature "R" is less than 350 nanometers, more preferably less than 100 nanometers, and most preferably less than 50 nanometers at the point 42, The pyramidal shape of tip 30 includes a plurality of surfaces that form a plurality of edges 37 and 39, as illustrated in FIG. 3A. The surfaces 39 and 37 are formed at angles α and β, respectively, with respect to a line normal to the connecting surface 44, as illustrated in FIG. 3A. Preferably, the angles α and β are between 10° and 75°. In one embodiment, the tip 30 takes a form having a base 40 at one end and a flat top 54 at an opposing end, as illustrated in FIG. 3E. The flat top 54 allows for the production of larger pixels 66 than the point 42, in order to increase throughput in applications where lower resolution is acceptable. Preferably, the flat top 54 has less surface area than the base 42, In one embodiment, the tip 30 and the cantilever beam 28 are integrally formed, as illustrated in FIG. 2E and FIG. 3B. In one embodiment, the tip 30 is flat and is integrally formed at one end of the cantilever beam 28, as illustrated in FIG. 3B. In one embodiment, the tip 30 coats at least one surface of the cantilever 28, as illustrated in FIG. 3C. In another embodiment, the tip 30 coats one end of the cantilever 28, as illustrated in FIG. 3D. In one embodiment, the tip 30 includes a flat surface 90 upon which a pattern of ink 60 may be formed, as described below and as illustrated in FIGS. 3B, 3C, 3D, 3E. The flat surface 90 does not have to be exactly flat. The flat surface 90 is able to accept a plurality of inks 60 and a plurality of patterns are able to be formed upon the flat surface 90, The flat surface 90 comprises a material such as photoresist; SU-8; metals such as permalloy, copper, tungsten, titanium, aluminum, silver, and gold; oxides such as silicon dioxide, silicon oxide, and silicon oxynitride; nitrides such as silicon nitride and titanium nitride; and polymers such as poly(dimethylsiloxane) (PDMS), polyimide, parylene, and elastomers such as silicone and rubber. Preferably, the flat surface 90 comprises a polymer.

The cantilever beam 28 has a connecting surface 44 opposed to a mounting surface 46, Preferably, the mounting surface 46 is connected with a handle 134, as illustrated in FIG. 2E. In one embodiment, the mounting surface 46 is connected with an adhesion island 132, as illustrated in FIG. 2E. Preferably, the cantilever beam 28 has a thickness "t", defined as the distance between the connecting surface 44 and the mounting surface 46, of between 1 and 10 microns, a length "l" of between 100 and 1,000 microns, and a width "w" of between 10 and 500 microns. In one embodiment, the probe 27 comprises individual actuators on the cantilever beam 28 for height adjustment of the probe 27, Shown in FIGS. 1A-1D, in cross-section, are process steps for the fabrication of an SPM probe 27 in accordance with one preferred embodiment of the invention. As illustrated in FIG. 1A, a substrate 20 is provided. Preferably, the substrate 20 comprises a single crystal silicon substrate, however, the substrate 20 may comprise other materials. Preferably, the substrate 20 comprises a thickness of 50 to 1000 microns, and more preferably, 300 to 500 microns. Preferably, the substrate 20 has a top surface 21 that has been previously processed and cleaned to remove debris and native oxides.

A cavity 22 is formed in the substrate 20, and more particularly, in the top surface 21 of the substrate 20, Preferably, the cavity 22 is formed by etching a shape into the substrate 20, however other means for forming the cavity 22 may be used. In one embodiment, the cavity 22 is formed using anisotropic etching. Preferably, the cavity 22 is formed by etching the substrate 20 wherein the cavity is bound by at least three surfaces that meet at a point. The size and shape of the cavity 22 may be controlled by adjusting the size of a mask opening used to form the cavity 22, and the and the amount of time the for the etching of the cavity 22, In one embodiment, the cavity 22 forms a sharp point at the bottom of the cavity 22, resulting in a tip 30 with a point 42, While in another embodiment, the bottom of the cavity 22 is flat, resulting in a tip 30 with a flat top 54, as illustrated in FIG. 3E. Preferably, the substrate 20 is first oxidized and patterned followed by anisotropic wet silicon etching in ethylene diamine pyrocatechol (EDP) to form the inverted cavity 22, EDP may be obtained from Transene Company (Danvers, MA). If the etching time is sufficiently long, the resulting cavity 22 is bound by four silicon surfaces and will end at a sharp point. For shorter etching durations, a flat bottom of varying sizes may be formed. The cavity 22 serves as a mold to create the tip 30 of the probe 27, as described below. By adjusting the size of the mask opening and the wet silicon etching time, the shape of the bottom of the cavity 22 can be controlled. If the cavity 22 ends in a sharp point, then a sharp tip 30 having a point 42 forms, as illustrated in FIG. 3A. However, if the cavity 22 ends in a flat bottom, then a tip 30 with a flat top 54 forms, as illustrated in FIG. 3E. Tips 30 with a flat top 54 can be used to produce larger pixels 66 to increase throughput in applications where lower resolution is acceptable. The shape of the cavity 22 forms a three dimensional geometry that is opposite the desired shape of the tip 30, The cavity 22 serves as a mold for the tip 30 of the probe 27, as described below. Preferably, the cross-sectional area of the cavity 22, taken along a line that is generally parallel with the top surface 21, is greater near the opening of the cavity 22 than at the bottom of the cavity 22, where the point 42 of the tip 30 is formed.

Figure 1B:
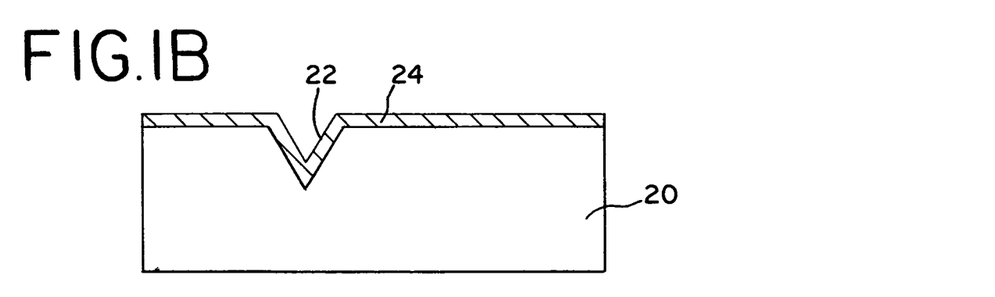
Figure 1C:
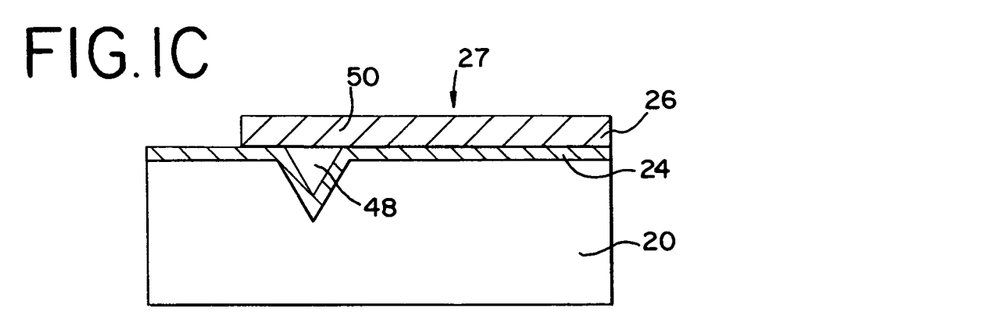
Figure 1D:
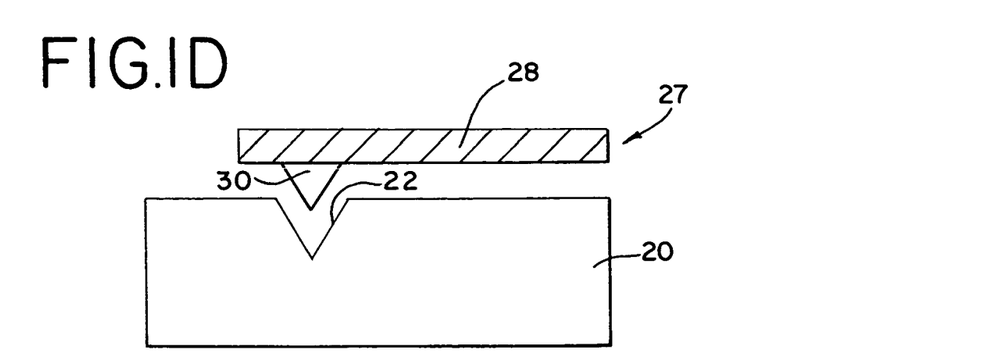

Upon forming the cavity 22, a sacrificial layer 24 is formed on the substrate 20, as illustrated in FIG. 1B. The sacrificial layer 24 may be formed by chemical reaction with the substrate 20, for example by oxidation, or by coating, for example with chemical vapor deposition or oblique angle physical vapor deposition. The sacrificial layer 24 is different from the material contained in the substrate 20, Multiple materials may also be used to form the sacrificial layer 24, In one embodiment, the sacrificial layer 24 comprises at least one of many types of materials such as photoresist; SU-8; metals such as permalloy, copper, tungsten, titanium, aluminum, silver, and gold; oxides such as silicon dioxide, silicon oxide, and silicon oxynitride; nitrides such as silicon nitride and titanium nitride; and polymers such as poly (dimethylsiloxane) (PDMS), polyimide, parylene, and elastomers such as silicone and rubber. Preferably, the sacrificial layer comprises aluminum, such as aluminum (99.999%) which may be obtained from Alfa Aesar (Ward Hill, Mass.). The thickness of the sacrificial layer 24 may vary, however, preferably, the thickness of the sacrificial layer 24 is between 1 and 100 microns, and more preferably between 10 and 50 microns.

Upon forming the sacrificial layer 24, a structural layer 26 is formed on the sacrificial layer 24, as illustrated in FIG. 1C. The structural layer 26 may be formed by chemical reaction, for example by oxidation, or by coating, for example with chemical vapor deposition or oblique angle physical vapor deposition. In one embodiment, the structural layer 26 is formed by depositing thin metal films, electroplating, or spin on polymer deposition. Preferably, the structural layer 26 comprises a material that is different from the materials contained in the sacrificial layer 24, Multiple materials may also be used to form the structural layer 26, In one embodiment, the structural layer 26 comprises at least one of many types of materials such as photoresist; SU-8; metals such as permalloy, copper, tungsten, titanium, aluminum, silver, and gold; oxides such as silicon dioxide, silicon oxide, and silicon oxynitride; nitrides such as silicon nitride and titanium nitride; and polymers such as poly(dimethylsiloxane) (PDMS), polyimide, parylene, and elastomers such as silicone and rubber. In one embodiment, the structural layer 26 comprises a polymer, and more preferably, an elastomer. Preferably, the polymer is formed by mixing a series of precursors in viscous liquid form, and then pouring the liquid over the substrate 20 and into the cavity 22, Excess polymer is then removed using a moving blade, a process of which is described in more detail in "Precision Patterning of PDMS Thin Films: A New Fabrication Method and Its Applications," by K. Ryu and C. Liu, Sixth International Symposium on Micro Total Analysis System (mTAS), Nara, Japan, 3-7 Nov. 2002.

In one embodiment, the structural layer 26 comprises a 10:1 (v:v) mixture of PDMS-SYLGARD™ 184 Silicone Elastomer Base and SYLGARD™ 184 Silicone Elastomer Curing Agent. SYLGARD™ 184 Silicone Elastomer Base and SYLGARD™ 184 Silicone Elastomer Curing Agent may be obtained from Dow Corning Corporation (Midland, MI). In one embodiment, the structural layer 26 comprises HD-4000 polyimide. HD-4000 polyimide may be obtained from HD MicroSystems (Wilmington, Del.). The thickness of the structural layer 26 may vary, however, preferably, the thickness of the structural layer 26 is between 1 and 100 microns, and more preferably between 10 and 50 microns. In one embodiment, the structural layer 26 includes a tip layer 48 and a beam layer 50 on the tip layer 48, Preferably, the tip layer 48 is formed in the cavity 22, and more preferably, the tip layer 48 fills up the entire cavity 22, In one embodiment, upon forming the tip layer 48, excess amount of the tip layer 48 are removed using chemical-mechanical polishing, etching, or a sharp blade. In one embodiment, excess amount of the tip layer 48 are removed using a moving blade. In one embodiment, the tip layer 48 comprises a 10:1 (v:v) mixture of PDMS-SYLGARD™ 184 Silicone Elastomer Base and SYLGARD™ 184 Silicone Elastomer Curing Agent. Preferably, upon forming the tip layer 48, tip layer 48 is then cured at a temperature of 70° C. to 110° C. for a duration of 20 to 40 minutes. Upon forming the tip layer 48, the beam layer 50 is formed on the tip layer 48, In one embodiment, the beam layer 50 comprises a thin layer of HD-4000 polyimide that is spin coated, patterned, and cured to form the cantilever beam 28, Preferably, the tip layer 48 and the beam layer 50 comprise different materials. For example, in one embodiment, the tip layer 48 comprises a polymer while the beam layer 50 comprises a metal. In one embodiment, the tip layer 48 and the beam layer 50 comprise polyamide. In one embodiment, the tip layer 48 comprises a metal while the beam layer 50 comprises a polymer, such as polyamide or parylene. In one embodiment, the tip layer 48 comprises an elastomer and the beam layer 50 comprises polyamide. The formation of the structural layer 26 should not disrupt the substrate 20 or the sacrificial layer 24, Upon forming the structural layer 26, the structural layer 26 is patterned to form a probe 27 having a cantilever beam 28 and a tip 30, as described above.

Upon forming the probe 27, the sacrificial layer 24 is removed, as illustrated in FIG. 1D. Preferably, the sacrificial layer 24 is removed using a process or material that does not harm the substrate 20 or the structural layer 26, In one embodiment, the sacrificial layer 24 is removed using aluminum etchant which may be obtained from Transene Company (Danvers, Mass.). Upon removing the sacrificial layer 24, the probe 27 is released from the substrate 20, The substrate 20 may then later be reused to form additional probes 27 since the geometry of the cavity 22 is not significantly damaged. In one embodiment, upon forming the probe 27, the tip 30 is further sharpened. Preferably, the probe 27 can be formed, in accordance with the above-described method, at a low temperature of no greater than 120° C.

By forming the probe 27 using the above-described method, the tip 30 of the probe is well defined by the inverted cavity 22 and therefore the process of forming a sharp tip 30, or a tip 30 with a small radius of curvature is possible by controlling the geometry of the inverted cavity 22 instead of controlling the geometry of the tip 30 itself. Additionally, since the substrate 20 can be reused, the materials cost for producing the probe 27 can be reduced. Moreover, the above-described method for fabricating a probe 27 allows for a variety of materials to be used to manufacture the probe 27 in additional to allowing the tip 30 and the cantilever beam 28 to comprise different types of materials. Furthermore, since the above-described method for fabricating a probe 27 involves only two layers, a sacrificial layer 24 and a structural layer 26, the method is highly efficient in comparison with prior methods, and thus allows for probes 27 to be formed at lower cost.

Figure 2A:
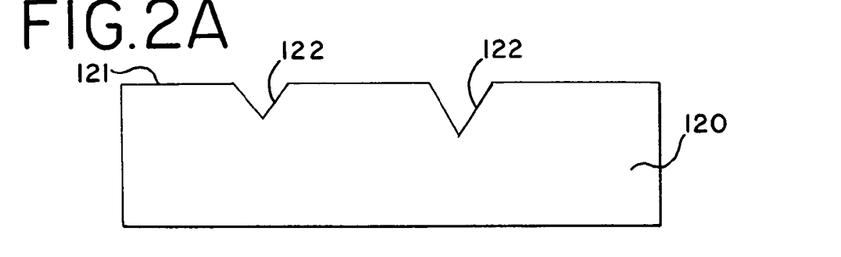
FIGS. 2A-2E illustrate, in cross-section, process steps for the fabrication of an SPM probe, in accordance with one preferred embodiment of the invention.
Figure 2B:
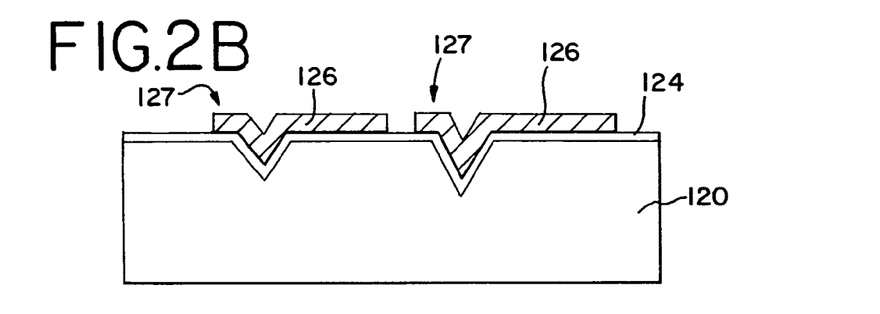
Figure 2C:
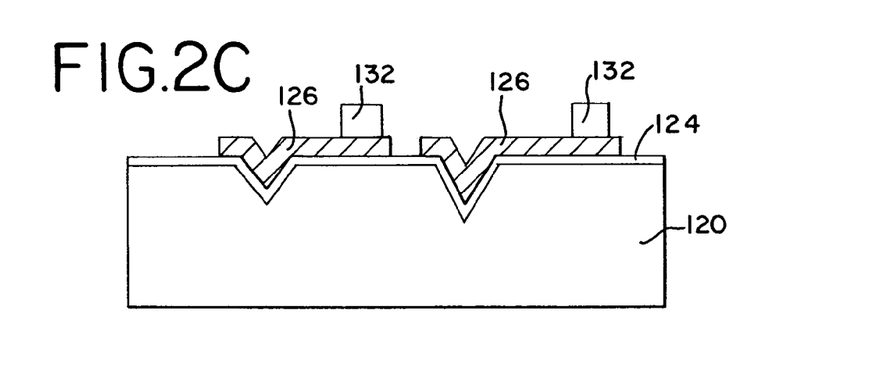
Figure 2D:
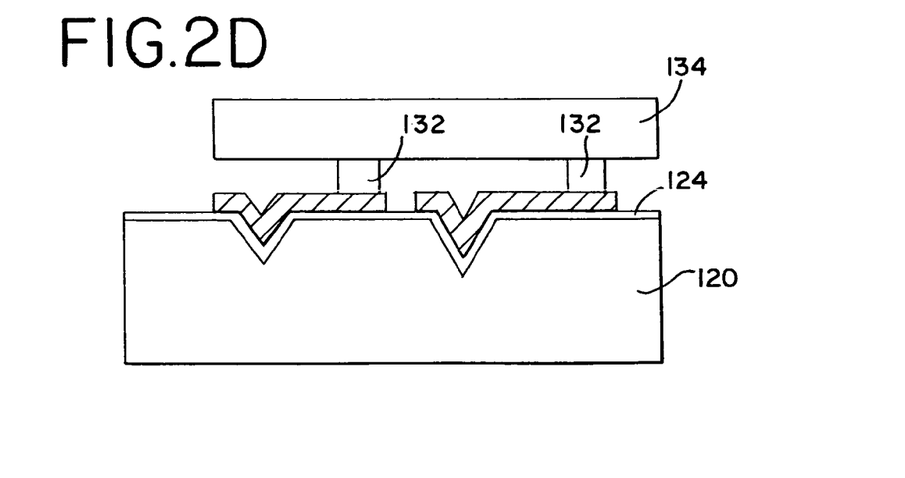
Figure 2E:
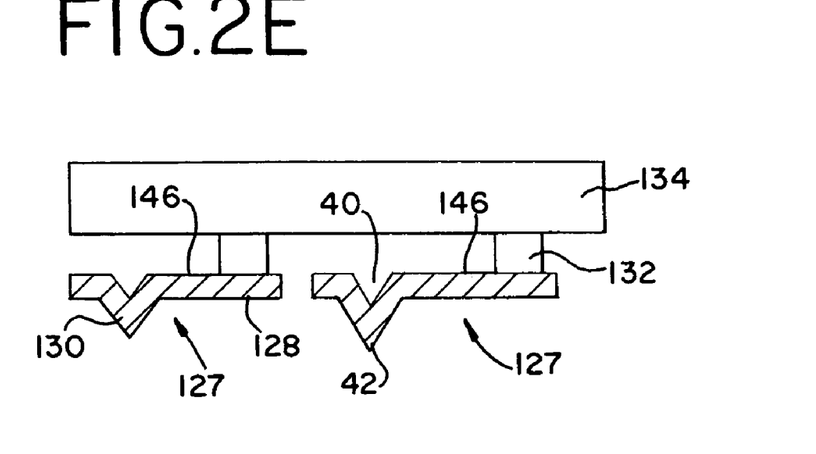
Figure 3A:
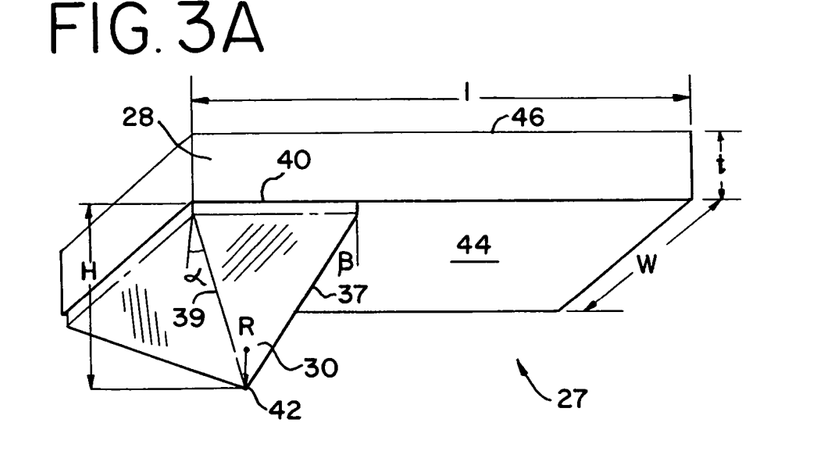
FIG. 3A is a perspective view of a probe, in accordance with one preferred embodiment of the invention.
Figure 3B:
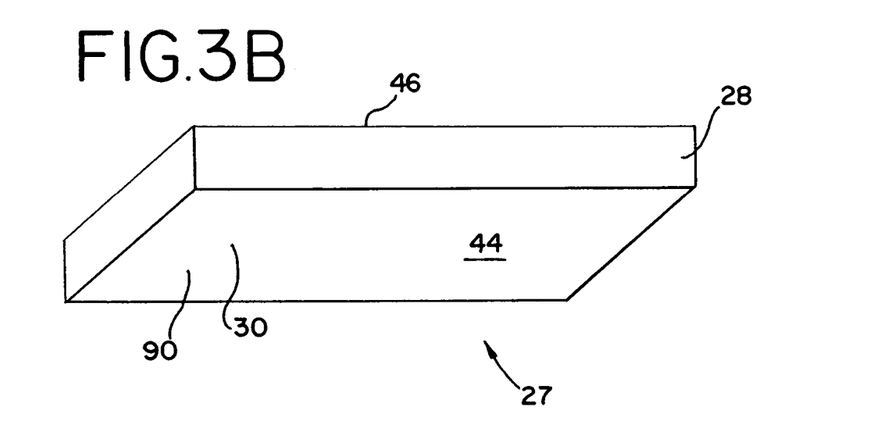
FIG. 3B is a perspective view of a probe, in accordance with one preferred embodiment of the invention.
Figure 3C:
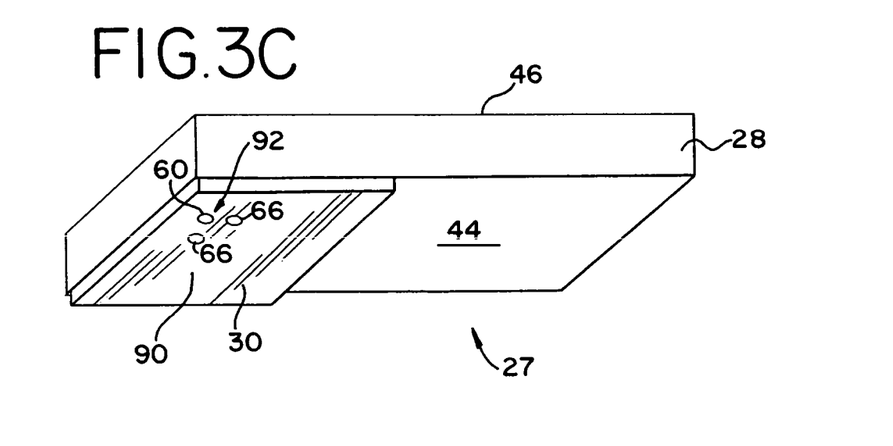
FIG. 3C is a perspective view of a probe, in accordance with one preferred embodiment of the invention.
Figure 3D:
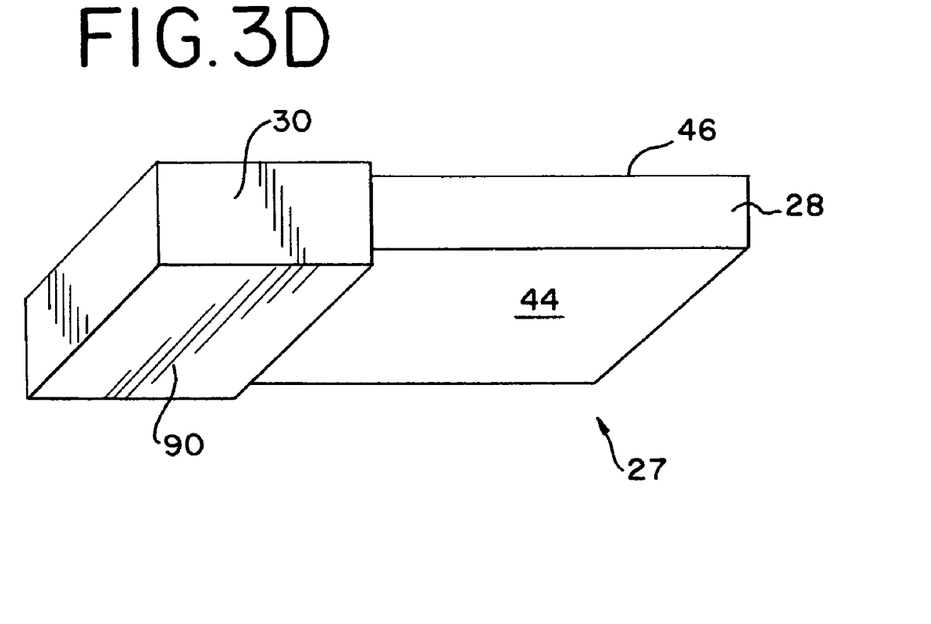
FIG. 3D is a perspective view of a probe, in accordance with one preferred embodiment of the invention.
Figure 3E:
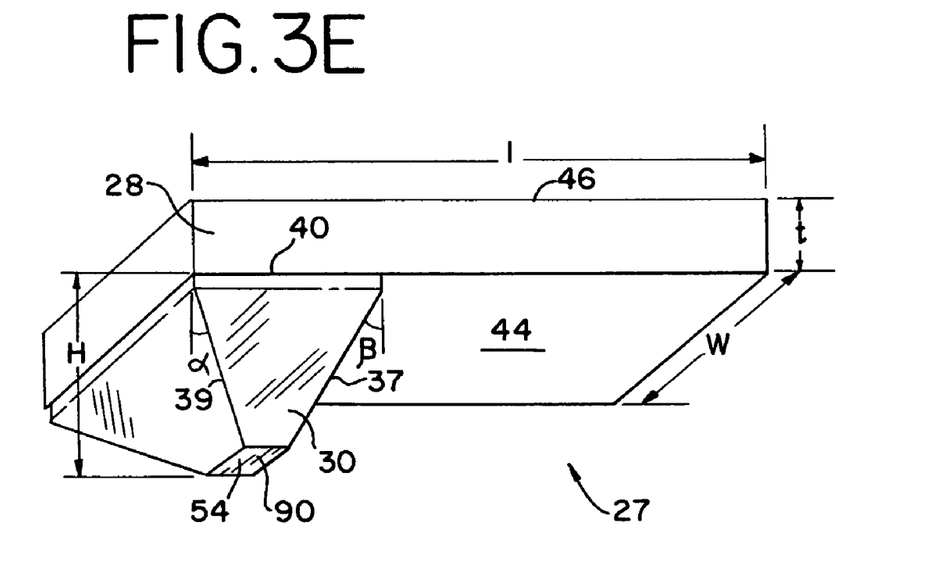
FIG. 3E is a perspective view of a probe, in accordance with one preferred embodiment of the invention.

Shown in FIGS. 2A-2E, in cross-section, are process steps for the fabrication of an SPM probes 127 in accordance with one preferred embodiment of the invention. Elements in FIGS. 2A-2E have reference numerals increased by one hundred from those for elements in FIGS. 1A-1D since they refer to like elements. As illustrated in FIG. 2A, a substrate 120 is provided wherein at least one cavity 122 is formed in the substrate 120, and more particularly, in the top surface 121 of the substrate 120, The shape of the cavity 122 forms a three dimensional geometry that is opposite the desired shape of the tin 130.

Upon forming the cavity 122, a sacrificial layer 124 is formed on the substrate 120, as illustrated in FIG. 2B. Upon forming the sacrificial layer 124, a structural layer 126 is formed on the sacrificial layer 124, The structural layer 126 is different from the material contained in the sacrificial layer 124, The structural layer 126 is then patterned to form at least one probe 127 having a cantilever beam 128 and a tip 130, as described above.

In one embodiment, upon patterning the structural layer 126, an adhesion island 132 is formed on the structural layer 126, as illustrated in FIG. 2C. The adhesion island 132 may be formed by depositing an adhesion layer and then patterning the adhesion layer to form an adhesion island 132, The adhesion layer comprises at least one of many types of materials such as photoresist; SU-8; metals such as permalloy, copper, tungsten, titanium, aluminum, silver, and gold; oxides such as silicon dioxide, silicon oxide, and silicon oxynitride; nitrides such as silicon nitride and titanium nitride; and polymers such as poly(dimethylsiloxane) (PDMS), polyimide, parylene, and elastomers such as silicone and rubber. Preferably, the adhesion layer has a thickness, that is the same as the height of the adhesion island 132, of between 1 and 50 micrometers. A handle 134, which preferably comprises a transfer substrate, is then formed on or placed on the adhesion island 132, The handle 134 is thus connected with the adhesion island 132 and the probe 127, Upon forming or placing the handle 134 on the adhesion island 132, the handle 134 is then bonded to the adhesion island 132, Preferably, the adhesion island 132 is a soft polymer which can be patterned to form an adhesion island.

Figure 2F:
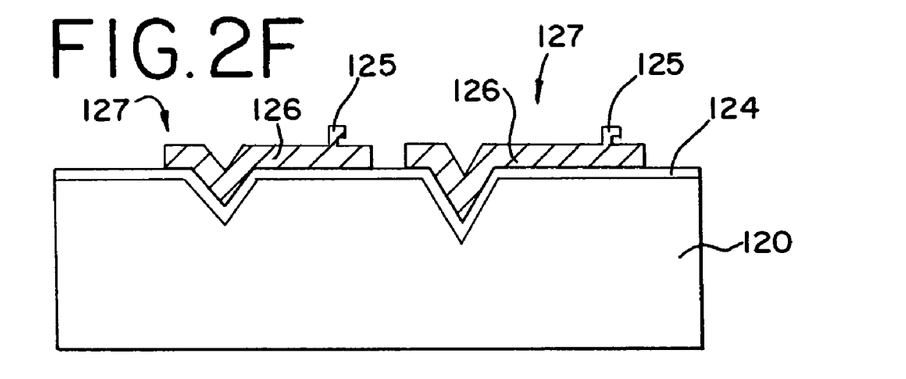
FIGS. 2F-2G illustrate, in cross-section, process steps for the fabrication of an SPM probe, in accordance with one preferred embodiment of the invention.
Figure 2G:
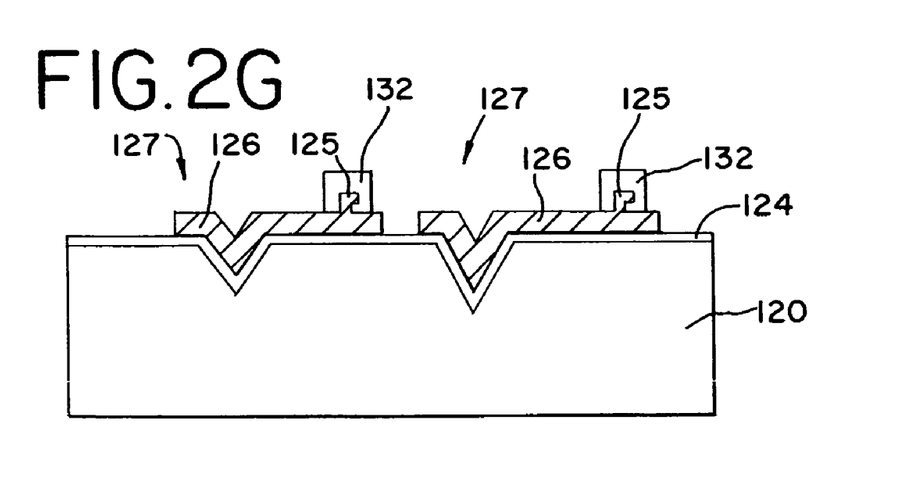

Preferably, upon heating the adhesion island 132, the adhesion island 132 is softened to help bond the adhesion island 132 to the handle 134, The handle 134 and the adhesion island 132 may be bonded in one of many ways, such as spin on bonding using photoresist or an adhesive polymer for adhesive bonding, which may be patterned (see for example "VOID-FREE FULL WAFER ADHESIVE BONDING" F. Niklaus, et al.); or high-temperature bonding, for example by heating the substrates together at about 1100° C. Preferably, the bonding process does not harm the substrate 20 or the probe 27. In one embodiment, the adhesion island 132 is bonded to the handle 134 using low-temperature bonding at less than 100° C. Alignment may be achieved using alignment mark, or using features present on the substrate 120, the handle 134, or the adhesion island 132, Upon forming the probe 127, which includes the handle 134, the adhesion island 132, and the structural layer 126 which forms the beam 128 and the tip 130, the sacrificial layer 124 is removed, as illustrated in FIG. 2E. The substrate 120 may then later be reused to form additional probes 127, In one embodiment, the structural layer 126 forms a hook 125, as illustrated in FIG. 2F. Upon forming the hook 125, the adhesion island 132 is formed on the hook 125, as illustrated in FIG. 2G. The hook 125 is used to improve the adhesion between the adhesion island 132 and the structural layer 126, since the area between the adhesion island 132 and the structural layer 126 may be small in a high-density probe array.

The individual processing steps used in accordance with the present invention are well known to those of ordinary skill in the art, and are also described in numerous publications and treatises, including: *Encyclopedia of Chemical Technology*, Volume 14 (Kirk-Othmer, 1995, pp. 677-709); *Semiconductor Device Fundamentals* by Robert F. Pierret (Addison-Wesley, 1996); *Silicon Processing for the VLSI Era* by Wolf (Lattice Press, 1986, 1990, 1995, vols 1-3, respectively); and Microchip Fabrication: A Practical Guide to Semiconductor Processing by Peter Van Zant (4th Edition, McGraw-Hill, 2000). In order to etch through the substrate, techniques such as deep ion etching may be used (also known as the Bosch process).

The present invention also describes a method for contact printing with an SPM probe, herein know as scanning probe contact printing. The SPM probe is formed using any one of a variety of techniques. Preferably, the SPM probe, is formed as described above. Upon forming the SPM probe, the SPM probe is then mounted onto a scanning probe microscope, such as an atomic force microscope (AFM), or a scanning tunneling microscope (STM). In one embodiment, the SPM probe is inked before being mounted onto the scanning probe microscope. In another embodiment, the SPM probe is inked upon being mounted onto the scanning probe microscope. Upon mounting the SPM probe onto the scanning probe microscope, the SPM probe is then positioned and put near a substrate, whereupon ink is transferred from the SPM probe to the substrate. The use of a scanning probe microscope to position the SPM probe allows for a high degree of accuracy for aligning and positioning the SPM probe to the substrate.

FIGS. 4A-4D illustrate, in a side view, process steps for scanning probe contact printing using an SPM probe 227, in accordance with one preferred embodiment of the invention. In one embodiment, the SPM probes 227 are used in the scanning probe contact printing method to generate submicron patterns 68, as illustrated in FIGS. 4A-4D, and FIGS. 5-6, For example, if the tip of the probe 227 is coated with a fluid, such as an ink 60, then a surface 64 of a substrate 62, such as a substrate made of glass, metal, silicon, or polymer, could be printed with the probes 227 after they have received the fluid 60, Biological arrays may similarly be formed, for example by using fluids containing biological compounds, such as nucleotides (RNA, DNA, or PNA), proteins (enzymes, antibodies, etc.), lipids, carbohydrates, etc. to spot a substrate, such as glass, silicon, or polymers. The scanning probe contact printing method combines the advantages of contact printing and scanning probe microscopy technologies by using a scanning probe 227 to transfer chemical or biological materials onto the substrate 62.

The probe 227 can be any type of SPM probe. Preferably, the probe 227 is a probe 27, as described above. Preferably, the scanning probe microscopy (SPM) probe 227 used in this embodiment includes an integrated tip 230 which comprises a material that adheres to fluid 60, such as, polymers, and more specifically, elastomers, like poly(dimethylsiloxane), silicone, rubber, and polyimide. In one embodiment, the tip of the probe 227 comprises a silicone elastomer. Preferably, the tip 230 comprises a polyimide, since polyimides are photodefinable and generally commercially available with a wide range of mechanical properties and achievable film thicknesses. The probe 227 includes a cantilever beam 228. In order to effectively move the tip 230 around to print arbitrary patterns 68, the probe 227, and more specifically, the cantilever beam 228 of the probe 227, has to have appropriate stiffness. The force constant (k) is used as a criterion in probe design. It is calculated using the formula for a simple fixed-free cantilever beam under small displacement assumption:

$$k = \frac{Ewt^3}{4l^3},$$

where E is the modulus of elasticity of the material, and w, t, l are the width, thickness, and length of the rectangular cantilever, respectively, as illustrated in FIG. 3. Preferably, the force constant for the cantilever beam 228 is between 0.01 to 0.5 N/m, more preferably between 0.03 to 0.3 N/m, and most preferably between 0.04 to 0.2 N/m.

Figure 6:
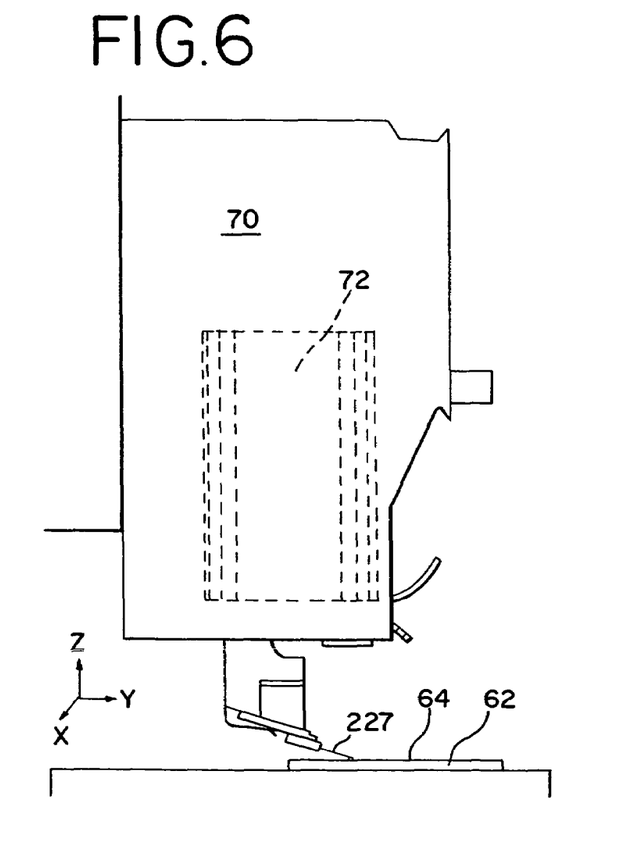
FIG. 6 is a side view of an atomic force microscope (AFM) scanning head connected with a probe, in accordance with one preferred embodiment of the invention.

Upon forming the probe 227, the probe 227 is then mounted onto a scanning probe microscope instrument, such as an atomic force microscope (AFM) 70, as illustrated in FIG. 6. While an atomic force microscope is illustrated in FIG. 6, the probe 227 may be mounted onto any type of scanning probe microscope, such as, but not limited to an AFM or an STM.

Figure 4A:
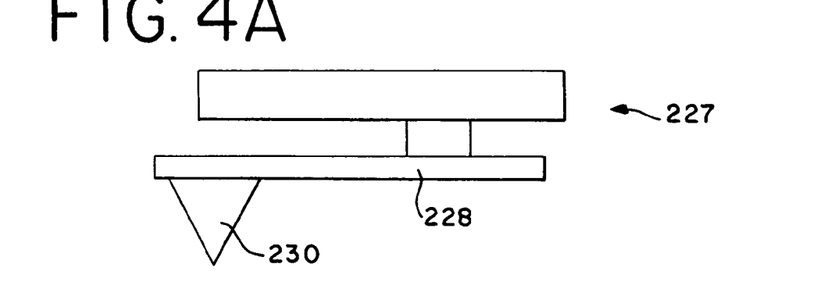
FIGS. 4A-4D illustrate, in a side view, process steps for contact printing with a scanning probe, in accordance with one preferred embodiment of the invention.
Figure 4B:
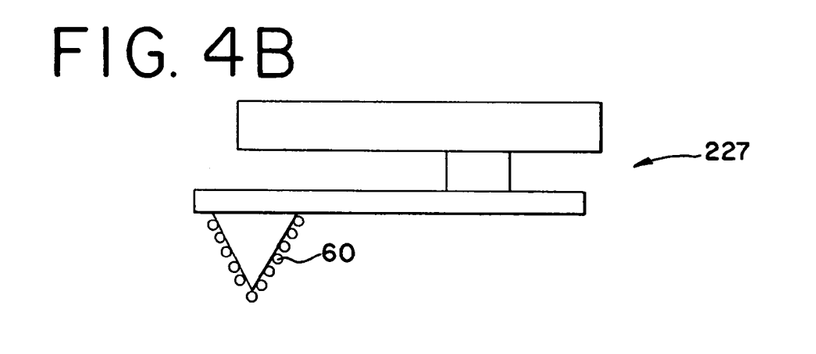

Upon forming the probe 227, ink 60 is attached to the tip 230 of the probe 227, as illustrated in FIG. 4B. Attaching ink 60 to the tip 230 of the probe 227 is also referred to herein as inking the probe 227. The ink 60 may comprise any material which may be dispersed or dissolved in a solvent, such as, nucleic acids, proteins, and peptides. In one embodiment, the probe 227 is inked before being mounted onto the scanning probe microscope. In another embodiment, the probe 227 is inked upon mounting the probe 227 onto the scanning probe microscope. The probe 227 may be inked in a variety of ways, such as a contact inking method, as described below, and other such methods. For example, in one embodiment, the probe 227, and more specifically, the tips 230 of the probe 227, are inked by positioning the probe 227 near or in contact with a second probe with an already inked tip. Preferably, the second probe is mounted onto a scanning probe microscope for accurate positioning. In one embodiment, the probe 227 is inked by placing the probe 227, and preferably, by placing the tip of the probe 227, near or in contact with a well filled with ink. In one embodiment, the probe 227 is inked by placing the probe 227 near or in contact with a pad that comprises ink. Preferably, the pad comprises PDMS.

Figure 4C:
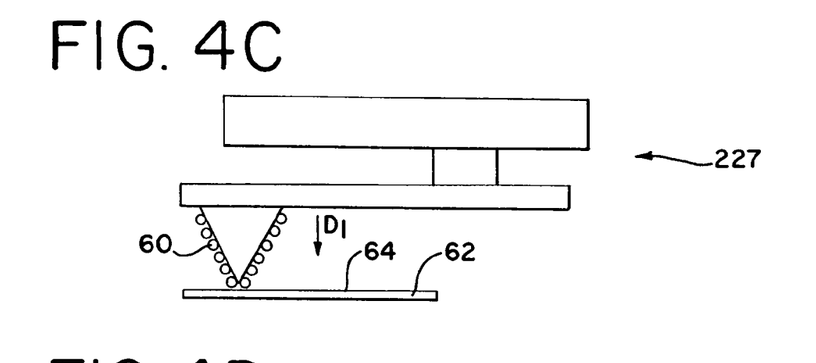
Figure 4D:
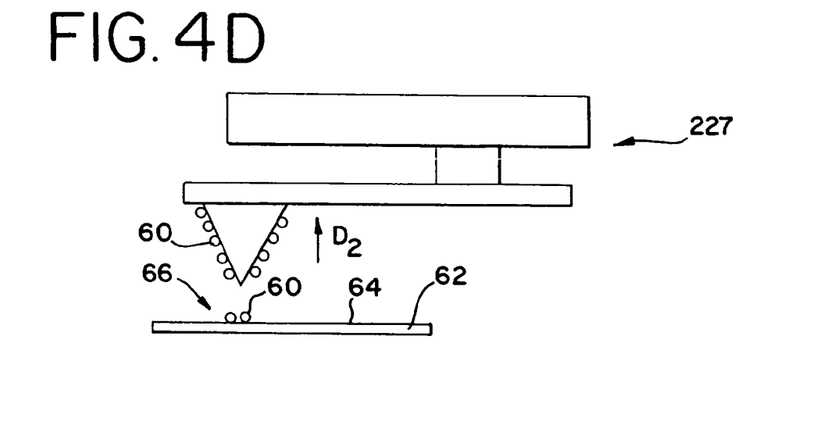
Figure 5:
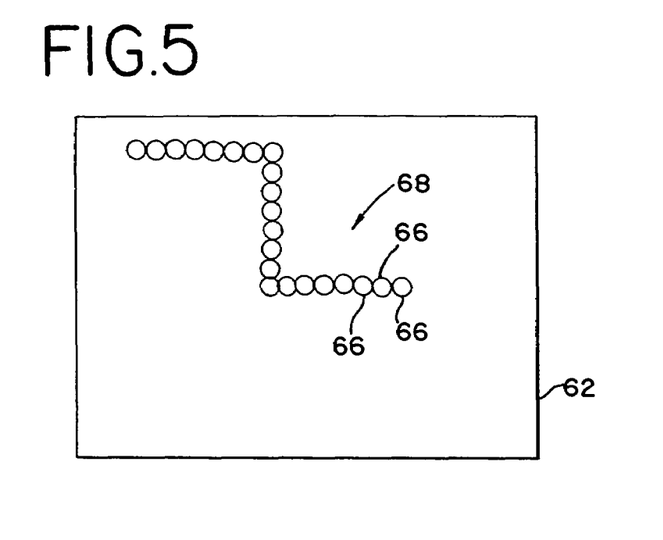
FIG. 5 is a top view of a pattern 68 formed using a scanning probe contact printing process, in accordance with one preferred embodiment of the invention.
Figure 8:
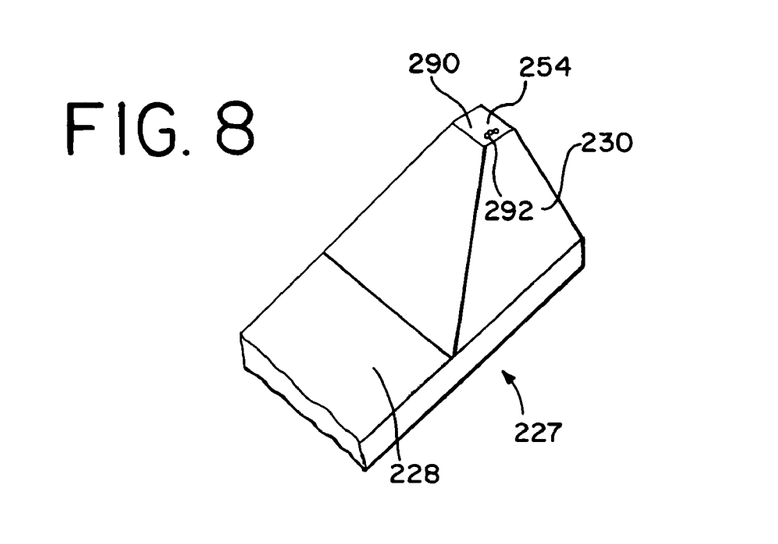
FIG. 8 is a perspective view of a probe 27 having a flat top, in accordance with one preferred embodiment of the invention.

In one embodiment, the tip 230 of the probe 227 does not form a point 42, but rather, the tip 230 forms a flat surface 290 which is inked, such as flat top 54 or 254, as illustrated by tips 30 in FIGS. 3B, 3C, 3D, 3E, and 8, Preferably, ink 60 is patterned onto a flat surface, such as flat surface 90 or flat surface 290, to form an ink pattern 92, an ink pattern 292, or a pattern of ink 60, as illustrated in FIGS. 3C and 8, The ink 60 may be patterned onto the flat surface 290 by using a second probe 227 attached to a scanning probe microscope. Preferably, the ink pattern 92 comprises more than one pixel 66, In one embodiment, the ink pattern 92 comprises a first and a second pixel 66, wherein the first pixel 66 does not come into contact with the second pixel 66, as illustrated in FIG. 3C. Upon patterning the flat surface 290 with ink 60, the flat surface 290 then is placed near, or comes into contact with, the substrate 62, In one embodiment, upon patterning the flat surface 290 with ink 60, the flat surface 290 is placed near, or comes into contact with, the substrate 62 a plurality of times in order to make multiple copies of the patterned ink from the flat surface 290 onto the substrate 62, or onto multiple substrates 62, Upon mounting the probe 227 onto the scanning probe microscope and attaching ink to the tip 230, also know as "inking the probe," the probe 227, the probe 227 is then positioned and placed near or brought into contact with a substrate 62, whereupon the ink 60 is transferred from the probe 227 to the substrate 62, as illustrated in FIGS. 4C and 4D. The substrate 62 may be any type of material, such as silicon, gold, silver, aluminum, and paper. The tip 230 is positioned using the scanning probe microscope. Preferably, the tip 230 is placed near or brought into contact with the substrate by moving the tip 230 towards the substrate 62 in a first direction $D_1$, as generally shown by the arrow in FIG. 4C. Once the tip 230 is placed near or brought into contact with the substrate 62, ink 60 is transferred from the tip 230 to the substrate 62, Upon transferring ink 60 from the tip 230 to the substrate 62, the tip 230 is moved away from the substrate 62 in a second direction $D_2$, as illustrated in FIG. 4D. creating a dot or pixel 66 as illustrated in FIG. 5. The size of the pixel 66 is dependant upon the size of the tip 230 and the amount of time the tip 230 is in contact with or near the substrate 62, Arbitrary, connected patterns 68, such as lines or blocks, can be formed by connecting multiple pixels 66, in a method analogous to dot-matrix printing, as illustrated in FIG. 5. The probe 227 is compatible with commercial scanning probe machines. The above-described scanning probe contact printing method combines the chemical versatility and performance advantages of contact printing with the production flexibility and accuracy of scanning probe microscope machines. Additionally, no mask is necessary to produce arbitrary patterns 68, Using the above-described scanning probe contact printing method, nanometer registration accuracy is feasible.

Without further elaboration it is believed that on skilled in the art can, using the preceding description, utilize the invention to its fullest extent. The following example is merely illustrative of the invention and is not meant to limit the scope in any way whatsoever.

EXAMPLE

The probe 227 was mounted and tested on a Thermomicroscopes AutoProbe® M5 atomic force microscope (AFM). An organic molecule, 1-octadecanethiol (ODT), was used for the fluid 60, ODT (98%) may be obtained from Aldrich Chemical Company (Milwaukee, Wis.). The substrate 62 was a silicon chip coated with a 5-nm-thick chrome layer for adhesion promotion, and a 30-nm-thick gold layers. Preferably, the substrate 62 is formed from a single crystal silicon wafers ({100} orientation), which may be obtained from International Wafer Service (Portola Valley, Calif.). Gold (99.99%) for the gold layers may be obtained from Pure Tech (Brewster, N.Y.). A chromium evaporation source (chrome plated tungsten rod) to form the chrome layer may be obtained from R. D. Mathis Company (Long Beach, Calif.). A contact inking method, as described in "Contact-lnking Stamps for Microcontact Printing of Alkanethiols on Gold", by L. Libioulle, A. Bietsch, H. Schmid, B. Michel, and E Delamarche, Langrnuir, 1999, 15, pp. 300-304, was used to ink the tip 230 of the probe 227 with ODT. The tip 230 comprises PDMS. A fluid pad from which the tip 230 was to received the fluid 60, was first prepared by immersing a PDMS piece (4 mm*4 mm*0.3 mm) in 3 mM ethanolic ODT solution for at least 12 hours. After the fluid pad was impregnated with ODT solution, the fluid pad was dried in a nitrogen stream for 10 seconds. The fluid pad was then stored in a small glass Petri dish before use.

The probe 227 was mounted on an AFM scanning head 70, as illustrated in FIG. 6. While the scanning head 70 could move in a z direction, the sample stage of the scanning head 70 could move in x and y directions for rough alignment. For accurate movement in the printing process, the piezoelectric scanner 72 inside the scanning head 70 could be controlled by internal circuitry to expand or compress, moving the probe in x, y, and z directions with nanometer scale accuracy.

Figure 7A:
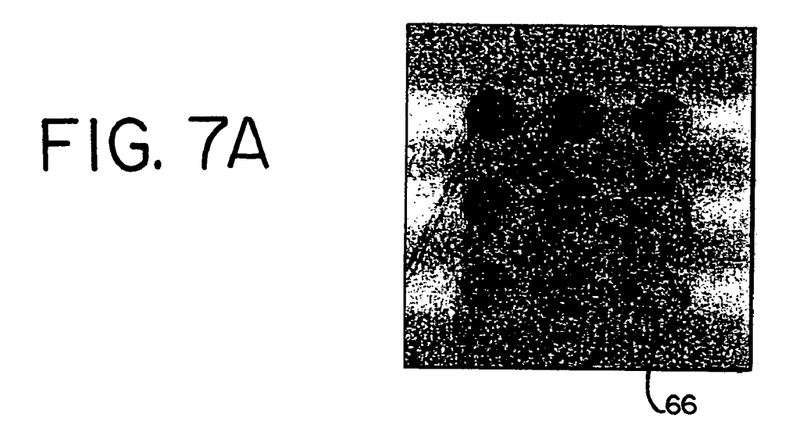
FIGS. 7A-7C illustrate lateral force microscopy (LFM) images of arrays of pixels generated using a scanning probe contact printing process, in accordance with one preferred embodiment of the invention.
Figure 7B:
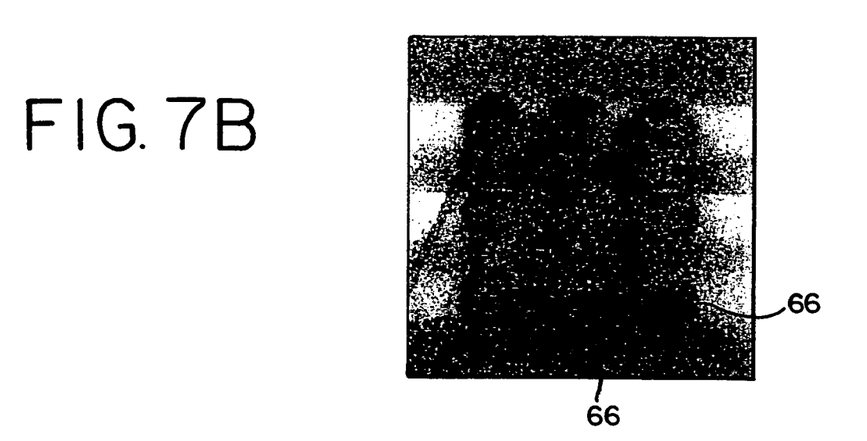
Figure 7C:
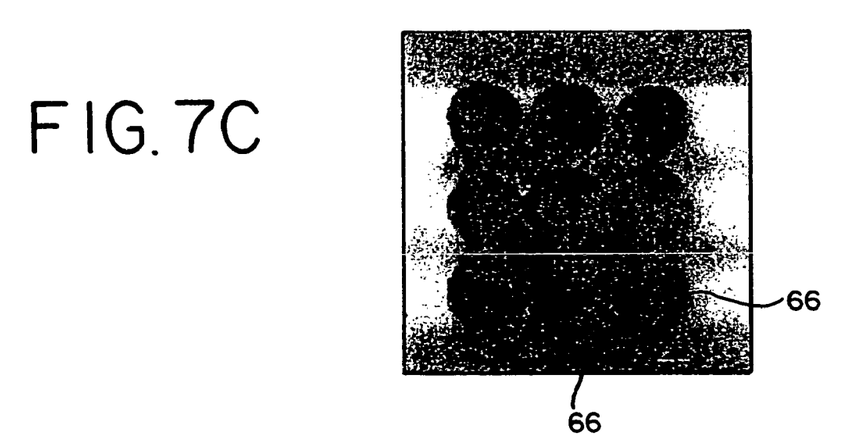

In our experiments, inking was first done by bringing the tip 230 into contact with a fluid pad, preferably, for between 5 and 15 minutes, and more preferably, for between 8 and 12 minutes. This allowed local transfer of ODT from the fluid pad to the tip 230, The similar elasticity and surface characteristics of the fluid pad and the tip 230 provided good contact at their interface, thus excessive contact force was not necessary. The quasi-continuous interface formed by both the PDMS surface of the fluid pad and the tip 230 also enabled homogeneous transfer of fluid 60 from the fluid pad to the tip 230, After the tip 230 was inked with a sufficient amount of fluid 60, in this case ODT, the tip 230 was moved to a designated location and lowered to contact the gold surface 64 of the substrate 62 to form a pixel 66, After every formation of a pixel 66, the probe 227 was lifted and moved to another location to form another pixel 66, Because of the capillary adhesive force at the interface between the tip 230 and the substrate 62, upon contact, the probe 227 could be lifted up a distance of several microns without interrupting the contact and fluid transfer between the tip 230 and the substrate 62, Hence contact printing could be conducted with even no or negative contact force between the tip 230 and the substrate 62, In our experiments, all contact printings were conducted with a contact force (F) between −200 nN to 200 nN. Please note that the contact force readings of between −200 nN to 200 nN may not be the actual contact force, however this is just representative of the contact force. As defined herein, the contact force (F) or tip-substrate interaction force is the z (vertical) component of the force exerted on the probe tip 230 when the tip 230 is in contact with the substrate 62, When the tip 230 is lowered to just contact with the substrate 62 without any overdrive, the contact force (F) is assumed to be 0, Further lowering the probe handle (overdrive) will cause a repulsive force (+z direction) exerted on the tip 230 by the substrate 62, If the probe handle 134 is withdrawn for a small distance, the adhesive force at interface between the tip 230 and the substrate 62 will try to hold the tip 230 down on the substrate 62, thus exerting a pulling (attractive) force (−z direction) on the tip 230, In both cases, the magnitude of the contact force (F) can be estimated as F=kΔz under small displacement assumption, where k is the force constant of the cantilever and Δz equals to the small displacement of probe handle 134, The feature size of tip-based contact printing is affected by several factors, including the tip geometry, the tip-substrate, the contact time, the relative humidity of environment, and other such parameters. With other parameters set, the printed pattern size of the pixel 66 is proportional to the contact time of the tip 230, As an example, FIGS. 7A-7C show lateral force microscopy (LFM) images of 3*3 arrays of pixels 66 generated using the above described SP-μCP method. The printing probe tip 230 has a flat top 254 of 1.5 μm*1.5 μm, as shown in FIG. 8. The size of each image shown in FIGS. 7A-7C is 12 um*12 μm. The tip 230 of the probe 227 used to create the pixels 66 in FIGS. 7A-7C has a flat top 254 of 1.5 μm*1.5 μm, as illustrated in FIG. 8. By comparison, we see that the feature size increases as the tip-substrate contact time is increased from FIG. 7A to FIG. 7C. For the image shown in FIG. 7A, the contact time between the substrate 62 and the tip 230 was approximately 5 seconds and the diameter D of the pixel was 1.8 μm. For the image shown in FIG. 7B, the contact time between the substrate 62 and the tip 230 was approximately 10 seconds and the diameter D of the pixel was 2.1 μm. For the image shown in FIG. 7C, the contact time between the substrate 62 and the the tip 230 was approximately 20 seconds and the diameter D of the pixel was 2.4 μm. The environment temperature used to create the pixels 66 shown in FIGS. 7A-7C was 21° C., and the relative humidity was 27%.

Figure 9:
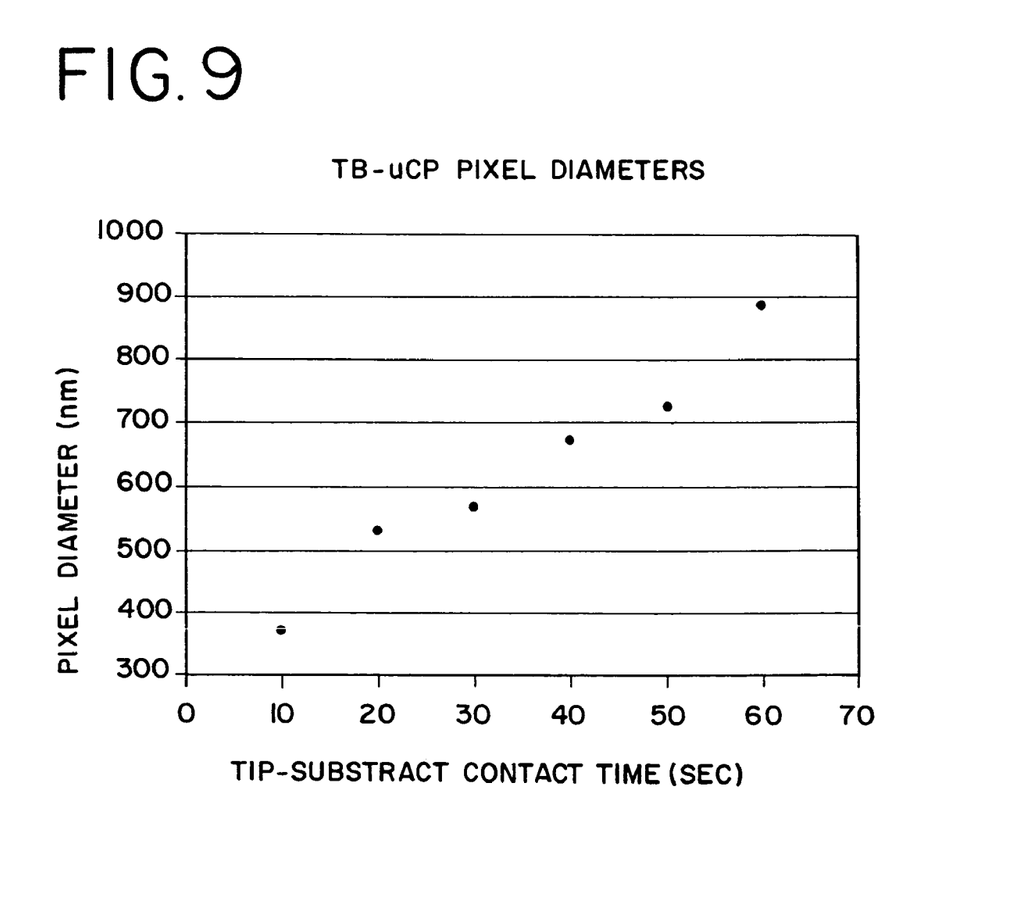
FIG. 9 is a chart comparing the pixel diameter to the contact time between the tip and the substrate, in accordance with one preferred embodiment of the invention.

FIG. 9 shows the diameter of pixels 66 printed from ODT by a sharp tip 230 with varying contact time between the substrate 62 and the tip 230, A generally linear relationship between the diameter of a pixel 66 and the contact time between the substrate 62 and the tip 230 can be observed. The environment temperature used to create the pixels 66 charted in FIG. 9 was 25° C., and the relative humidity was 55%. The tip 230 of the probe 227 used to create the pixels 66 charted in FIG. 9 has a radius of curvature R of 300 nm.

Figure 10:
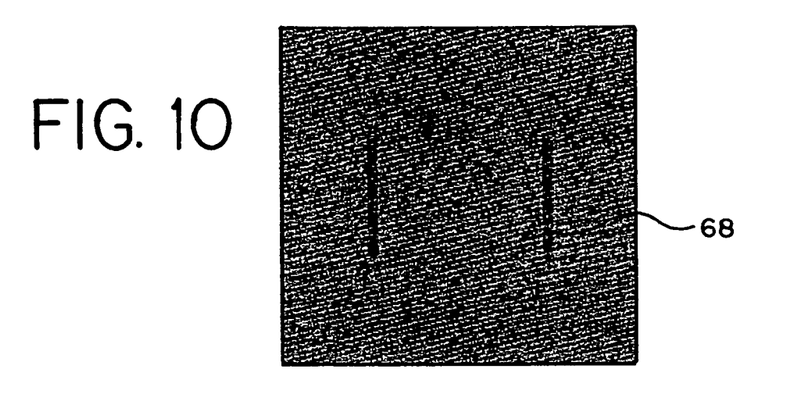
FIG. 10 illustrates a lateral force microscopy (LFM) image of two patterns formed using a scanning probe contact printing process, in accordance with one preferred embodiment of the invention.

Lines and other complicated patterns 68 could be formed by placing pixels 66 close to each other. FIG. 10 shows an LFM image of two patterns 68, each forming lines with a length L of 10 μm. The size of the image shown in FIG. 10 is 30 um*30 μm. The width W of the lines formed in FIG. 10 is 890 nm. Each line comprises 20 pixels 66, The contact time between the substrate 62 and the tip 230 for forming each pixel 66 in FIG. 10 was 60 seconds. The distance between each pixel 66 in FIG. 10 is 500 nm. The environment temperature used to create the pixels 66 shown in FIG. 10 was 25° C., and the relative humidity was 55%. The tip 230 of the probe 227 used to create the pixels 66 shown in FIG. 10 has a radius of curvature R of 300 nm.

Figure 11A:
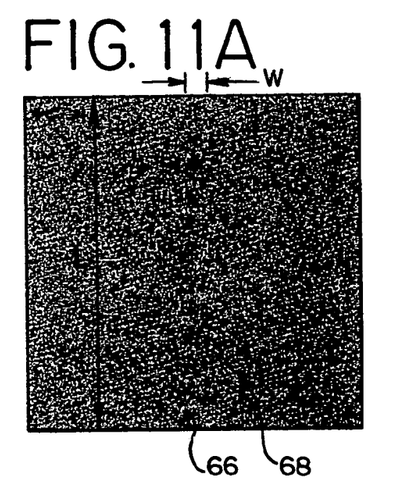
FIGS. 11A-11D illustrate lateral force microscopy (LFM) images of patterns formed using a scanning probe contact printing process, in accordance with one preferred embodiment of the invention.
Figure 11B:
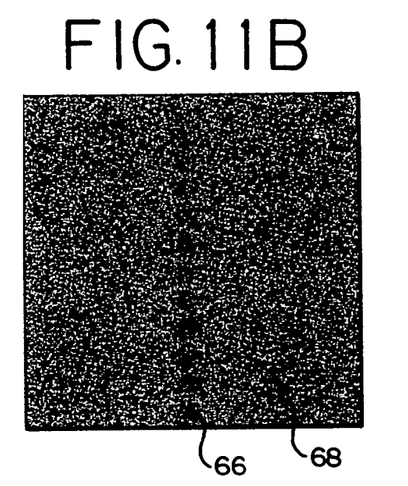
Figure 11C:
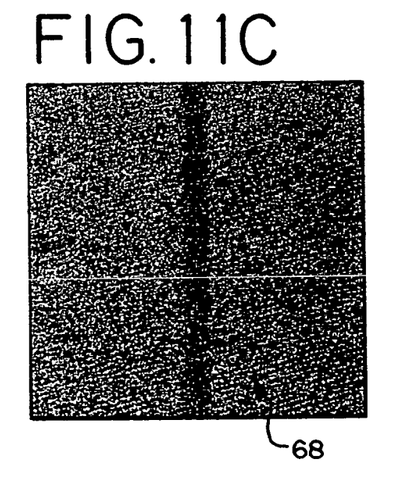
Figure 11D:
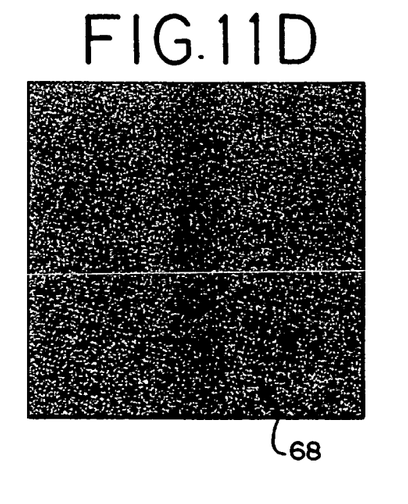

Comparison results of lines generated with different contact time between the substrate 62 and the tip 230 are shown in FIGS. 11A-11D. The size of the image shown in FIGS. 11A-11D is 6 um*6 μm. Each line comprises 20 pixels 66 with a distance between adjacent pixels 66 of 500 nm. The environment temperature used to create the pixels 66 shown in FIGS. 11A-11D was 25° C., and the relative humidity was 55%. The tip 230 of the probe 227 used to create the pixels 66 shown in FIGS. 11A-11D has a radius of curvature R of 300 nm. In FIG. 11A, a pattern 68 in the shape of a line was formed with a contact time between the substrate 62 and the tip 230 of 10 seconds because the size of each pixel 66 was smaller than the distance between adjacent pixels 66, The width W of the line formed in FIG. 11A is 305 nm. In FIG. 11B the contact time between the substrate 62 and the tip 230 to form each pixel 66 was 20 seconds and the width of the line formed is 434 nm. In FIG. 11C the contact time between the substrate 62 and the tip 230 to form each pixel 66 was 30 seconds and the width of the line formed is 480 nm. In FIG. 11D the contact time between the substrate 62 and the tip 230 to form each pixel 66 was 60 seconds and the width of the line formed is 890 nm. By adjusting contact time between the substrate 62 and the tip 230 and the distance between adjacent pixels 66, a line having a width W of less than 500 nm or even less than 300 nm can be achieved. In one embodiment, the width W of the formed line is approximately equivalent to the diameter D of a pixel 66, as illustrated in FIG. 11A.

In the above-described scanning probe contact printing method, the amount of interaction force and lateral friction between the tip 230 and the substrate 62 have also reduced the amount of wear to the tip 230, The PDMS tip 230 used in the experiments showed no apparent change of curvature radius after more than 24 hours of the scanning probe contact printing method. In addition, the scanning probe contact printing method also proved an efficient method to fill the tip 230 with sufficient ink. Additionally, a cleanroom environment should improve the quality of the patterns 68 formed by the above-described scanning probe contact printing method.

Numerous additional variations in the presently preferred embodiments illustrated herein will be determined by one of ordinary skill in the art, and remain within the scope of the appended claims and their equivalents. For example, while the examples provided above relate to silicon-based semiconductor substrates, it is contemplated that alternative semiconductor materials can likewise be employed in accordance with the present invention, and that the semiconductor substrates may be undoped, P-doped, or N-doped. Suitable materials for the substrates include but are not limited to silicon, gallium arsenide, germanium, gallium nitride, aluminum phosphide, Si1-xGex and AlxGa1-xAs alloys, wherein x is greater than or equal to zero and less than or equal to one, the like, and combinations thereof. Additional examples of materials for use, methods, and terms used in accordance with the present invention are set forth in the following references: "Semiconductor Device Fundamentals" by Robert F. Pierret, p. 4, Table 1.1, Addison-Wesley, 1996; "Soft Lithography and Microfabrication," by C. Brittain, K. Paul, and G. whitesides, Physics World 1998, 11, 31-36; "Patterning Self-Assembled Monolayers: Applications in Materials Science," by A. Kumar, H. A. Biebuyck, and G. M. Whitesides, Langmuir, 1994, 10, pp. 1498-1511; "Fabrication and Imaging of Two-Dimensional Patterns of Proteins Adsorbed on Self-Assembled Monolayers by Scanning Electron Microscopy", by G. P. Lopez, H. A. Biebuyck, R. Harter, A. Kumar, and G. M. Whitesides, Journal of the American Chemical Society, 1993, 115, pp. 10774-10781; "Micro-Stamp Patterns of Biomolecules for High-Resolution Neuronal Networks," by D. W. Branch, J. M. Corey, J. A. Weyhenmeyer, G. J. Brewer, and B. C. Wheeler, Medical and Biological Engineering and Computing, vol. 36, pg. 135-141; "Patterning of a Polysiloxane Precursor to Silicate Glasses by Microcontact Printing," by C. Marzolin, A. Terfort, J. Tien, and G. Whitesides, Thin Solid Films, 1998, 315, 9-12; "Soft Lithography", by Y. Xia and G. M. Whitesides, Annual Review of Material Science, 1998, 28, pp. 153-84; "Precision Patterning of PDMS Thin Films: A New Fabrication Method and Its Applications," by K. Ryu, C. Liu, 6th International Symposium on Micro Total Analysis System (µTAS), Nara, Japan, 2002; and "Contact-Inking Stamps for Microcontact Printing of Alkanethiols on Gold," by L. Libioulle, A. Bietsch, H. Schmid, B. Michel, and E Delamarche, Langinuir, 1999, 15, pp. 300-304, Although the invention has been described and illustrated with reference to specific illustrative embodiments thereof, it is not intended that the invention be limited to those illustrative embodiments. Those skilled in the art will recognize that variations and modifications can be made without departing from the spirit of the invention.

The invention claimed is:

1. A method for contact printing comprising:
    patterning a first ink on a surface of a scanning probe microscopy probe to form a first ink pattern on the surface; and
    positioning the surface near a first substrate, wherein the first ink pattern is transferred from the surface to the first substrate.

2. The method of claim 1, wherein the first ink pattern is transferred from the surface to the substrate a plurality of times.

3. The method of claim 1 further comprising positioning the surface near a second substrate, wherein the first ink pattern is transferred from the surface to the second substrate.

4. The method of claim 1 further comprising patterning a second ink on the surface to form a second ink pattern on the surface.

5. The method of claim 4, wherein the first ink and the second ink comprise the same material.

6. The method of claim 1, wherein the first ink pattern comprises more than one pixel.

7. The method of claim 6, wherein the first ink pattern comprises more than two pixels.

8. The method of claim 6, wherein the pixels do not come into contact with each other.

9. The method of claim 4, wherein the second ink pattern comprises more than one pixel.

10. The method of claim 9, wherein the second ink pattern comprises more than two pixels.

11. The method of claim 4, wherein the first and second ink patterns are transferred from the surface to the first substrate.

12. The method of claim 1 further comprising mounting the probe to a scanning probe microscope.

13. The method of claim 12 where the patterning the first ink on the surface of the probe is performed before mounting the probe.

14. The method of claim 12 where the patterning the first ink on the surface of the probe is performed after mounting the probe.

* * * * *